United States Patent
Adivarahan et al.

(10) Patent No.: US 9,859,457 B2
(45) Date of Patent: Jan. 2, 2018

(54) SEMICONDUCTOR AND TEMPLATE FOR GROWING SEMICONDUCTORS

(71) Applicant: Nitek, Inc., Columbia, SC (US)

(72) Inventors: Vinod Adivarahan, Columbia, SC (US); Asif Khan, Irmo, SC (US); Iftikhar Ahmad, Irmo, SC (US); Bin Zhang, Lexington, SC (US); Alexander Lunev, Columbia, SC (US)

(73) Assignee: Nitek, Inc., Columbia, SC (US)

( * ) Notice: Subject to any disclaimer, the term of this patent is extended or adjusted under 35 U.S.C. 154(b) by 36 days.

(21) Appl. No.: 14/715,177

(22) Filed: May 18, 2015

(65) Prior Publication Data
US 2015/0263221 A1    Sep. 17, 2015

Related U.S. Application Data

(63) Continuation-in-part of application No. 12/934,652, filed as application No. PCT/US2009/038589 on Mar. 27, 2009, now abandoned.

(60) Provisional application No. 61/070,976, filed on Mar. 27, 2008, provisional application No. 61/999,465, filed on Jul. 28, 2014.

(51) Int. Cl.
| H01L 33/00 | (2010.01) |
| H01L 33/32 | (2010.01) |
| H01L 33/22 | (2010.01) |
| H01L 21/02 | (2006.01) |

(52) U.S. Cl.
CPC ...... *H01L 33/0075* (2013.01); *H01L 21/0242* (2013.01); *H01L 21/0254* (2013.01); *H01L 21/02389* (2013.01); *H01L 21/02458* (2013.01); *H01L 21/02505* (2013.01); *H01L 21/02639* (2013.01); *H01L 21/02647* (2013.01); *H01L 33/22* (2013.01); *H01L 33/32* (2013.01)

(58) Field of Classification Search
CPC .................................................. H01L 33/0075
USPC ..................................... 257/13, 76; 438/478
See application file for complete search history.

(56) References Cited

U.S. PATENT DOCUMENTS

| 2010/0276665 A1* | 11/2010 | Wang ................. H01L 21/0237 257/15 |
| 2011/0220867 A1 | 9/2011 | Khan et al. |
| 2012/0241755 A1* | 9/2012 | Romanov .......... H01L 21/0242 257/76 |
| 2014/0054753 A1* | 2/2014 | Liu ..................... H01L 21/3083 257/623 |

* cited by examiner

Primary Examiner — Bo Fan
(74) Attorney, Agent, or Firm — H.C. Park & Associates, PLC

(57) ABSTRACT

A template for a semiconductor device is made by providing an AGN substrate, growing a first layer of Group III nitrides on the substrate, depositing a thin metal layer on the first layer, annealing the metal such as gold so that it agglomerates to form a pattern of islands on the first layer; transferring the pattern into the first layer by etching then removing excess metal; and then depositing a second Group III nitride layer on the first layer. The second layer, through lateral overgrowth, coalesces over the gaps in the island pattern leaving a smooth surface with low defect density. A Group III semiconductor device may then be grown on the template, which may then be removed. Chlorine gas may be used for etching the pattern in the first layer and the remaining gold removed with aqua regia.

18 Claims, 4 Drawing Sheets

SEMICONDUCTOR AND TEMPLATE FOR GROWING SEMICONDUCTORS

PRIORITY CLAIM

This application claims priority from and the benefit of Provisional Application No. 61/999,465, filed on Jul. 28, 2014, and is a continuation-in-part of U.S. patent application Ser. No. 12/934,652, filed on May 31, 2011, which is a National Stage Entry of International Application PCT/US2009/38589, filed on Mar. 27, 2009, which claims priority from Provisional Application No. 61/070,976, filed on Mar. 27, 2008, each of which is hereby incorporated by reference for all purposes as if fully set forth herein.

BACKGROUND

Recently there has been a surge in the research and development of Group III-Nitride semiconductor-based, deep ultraviolet (UV) light emitting diodes (LEDs). This surge reflects appreciation of the value of these LEDs in water purification, air purification, epoxy curing, bio-detection and bio-medical applications, and other applications.

There is also interest in better semiconductor devices generally and sensors capable of detecting photons in the 250 A-500 A wavelength range.

Group III nitride compound semiconductors such as gallium nitride (GaN), aluminum nitride (AlN), indium nitride (InN), and combinations of these such as aluminum gallium nitride (AGN or AlGaN) (hereinafter referred to as a "Group III-nitrides") have been gaining attention as materials for semiconductor devices that emit light from the green portion of the visible region of the electromagnetic spectrum to the deep ultraviolet region. The term light-emitting device or LED will be used herein to refer to both light-emitting diodes and laser diodes that emit green, blue and ultraviolet radiation, unless otherwise specified. The ultraviolet portion of the electromagnetic spectrum is often subdivided by wavelength into UVA (315-380 nm), UVB (280-315 nm) and UVC (<280 nm).

LEDs are difficult to manufacture for a number of reasons. For example, defects arise from lattice and thermal mismatch between Group III Nitride-based semiconductor layers and substrates such as sapphire, silicon carbide, or silicon on which the LEDs are constructed. In addition, impurities and tilt boundaries result in the formation of crystalline defects. These defects have been shown to reduce the efficiency and effective lifetimes of these LEDs. Furthermore, these same defects have been observed for Group III-Nitride films grown hetero-epitaxially on the above-mentioned substrates, often with typical dislocation densities ranging from $10^8/cm^2$ to $10^{16}/cm^2$ for films grown via metal-organic chemical vapor deposition (MOCVD), molecular beam epitaxy (MBE), hydride vapor phase epitaxy (HVPE) and several other less common growth techniques. Reducing the dislocation density has accordingly become an important goal for improving the quality of LEDs.

One way to reduce the dislocation density is based on the use of epitaxial lateral overgrowth (ELOG), which is a well-known technique. With this method, the dislocation density can be reduced by three or four orders of magnitude, to about $10^5/cm^2$ to $10^6/cm^2$. This method, however, has been shown to be ineffective for the growth of aluminum-containing Group III Nitride-based semiconductors because of the tendency for the aluminum to stick to masked material and disrupt lateral overgrowth.

Several variations of ELOG have also been demonstrated including lateral growth (PENDEO) epitaxy, and facet-controlled epitaxial lateral overgrowth (FACELO) growth. However, all of these techniques suffer from the same issue plaguing aluminum-containing III-Nitride materials. Additionally, a technique called cantilever epitaxy involves growth from pillars that are defined through etching, as opposed, for example, to masking.

Currently, several research groups are actively developing low-defect density AlN substrates to improve the power-lifetime performance of the deep UV LEDs. There are reports of a new air-bridge-assisted, high-temperature (1500° C.) ELOG approach to deposit 12 μm thick, high-quality AlN layers over SiC substrates as templates for deep ultraviolet LEDs.

Yet another approach to decreasing defect density is a process referred to as pulsed lateral overgrowth (PLOG) wherein pre-formed layers are etched to define islands. By controlling the flow rate of precursor material, a layer coalesces over the islands. Pulsed lateral overgrowth of $Al_xGa_{1-x}N$ has previously been demonstrated as an approach for depositing 15-20 μm thick $Al_xGa_{1-x}N$ over basal plane sapphire substrates. Instead of the high temperature approach, a pulsed growth mode at 1150° C. was used to enhance Al-precursor mobility over the growth surface. These PLOG $Al_xGa_{1-x}N$ layers show a significantly reduced number of threading dislocations ($\sim 10^7/cm^2$) in the lateral overgrowth regions, which enables demonstration of optically-pumped lasing at 214 nm. In previous reports, the PLOG $Al_xGa_{1-x}N$ was grown either from shallow (~0.3 μm) trenched sapphire or from thin AlN etched templates (~0.3 μm).

Several other approaches to dislocation reduction have been reported that do not involve selective area growth, such as insertion of an interlayer between the substrate and the semiconductor layer to relieve strain, filtering dislocations by bending them into each other by controlling surface facet formation or by inserting a Group III-Nitride super-lattice layer as described in Applied Physics Letters, Jul. 22, 2002; Volume 81, Issue 4, pp. 604-606, between the buffer layer and the active layer.

Milliwatt-power, deep UV LEDs on sapphire substrates with AlGaN multiple-quantum-well (MQW) active regions have been previously reported for the UVA, UVB and the UVC regions. The LED designs are characterized by an AlN buffer layer deposited using pulsed atomic layer epitaxy (PALE), an $AlN/Al_xGa_{1-x}N$, super-lattice layer between the AlN buffer and an AlGaN n-contact layer for controlling the thin-film stresses and mitigating epilayer cracking; and a p-GaN/p-AlGaN hetero-junction contact layer for improved hole injection.

A majority of the current solutions for defect mitigation involve a superlattice. A superlattice is ultimately either a sacrificial layer or it is left as part of the finished LED but without function. A sacrificial superlattice represents material which must be manufactured and scrapped thereby increasing manufacturing and material cost. The superlattice is also detrimental to device performance because it is insulating and therefore contributes to heat build-up. The thickness deviation of AlN and AlGaN leads to eventual cracking of the superlattice layer due to strain and lattice mismatch. Controlling the thickness of individual layers, the quality of the epilayers and the composition of AlGaN in a superlattice layer is thus a major issue in growing high-quality, defect-free, thick UV LEDs with superlattices.

From the foregoing review, it is clear there has been considerable research expended to find a methods for mitigating defect propagation and strain management.

In spite of advances in material quality and improved manufacturing methods, LEDs and other semiconductor devices that operate in the visible green to ultraviolet region of the electromagnetic spectrum still suffer from difficulties in both materials and manufacturing techniques.

BRIEF DESCRIPTION OF THE DRAWINGS

In the figures.

DETAILED DESCRIPTION

The present process is for making a semiconductor device and a template that supports a semiconductor device, such as a light emitting diode or laser diode and a sensor capable of detecting photons in the 250 A-500 A wavelength range. The present template has higher quality, that is, it has a smoother, flatter epilayer with fewer defects on which to grow a semiconductor device.

The process begins by providing a substrate 10 and growing a first layer 16 on substrate 10. Substrate 10 may be made of a variety of standard substrate materials but a substrate of AlN is preferred over sapphire. First layer 16 is made of Group III nitrides.

Then a layer 22 of metal such as gold, palladium or platinum is deposited directly on first layer 16. Metal layer 22 may be applied to first layer 16 using pulsed vapor deposition or chemical vapor deposition. Any of the following may also be used: aluminum, vanadium, molybdenum, chromium, indium, tin, cobalt, ruthenium, rubidium, silicon, and oxides of these.

Metal layer 22 is thin, for example, 5 A to 5000 A. Metal layer 22 is then annealed for a limited time and at a limited temperature so that it agglomerates. The time and temperature of the annealing step are chosen to be shorter and cooler than those times and temperatures that would adversely affect the Group III composition of first layer 16, namely, a time and temperature that causes the metal to coalesce to form nanoscale islands 24, such as a temperature between 350° C. to 500° C. for a time between 10-15 seconds f or gold. Annealing of metal layer 22 is done in air or in a forming gas such as nitrogen gas or argon. The annealing oven is not preheated and cool down times are on the order of a few minutes.

Figure 1:
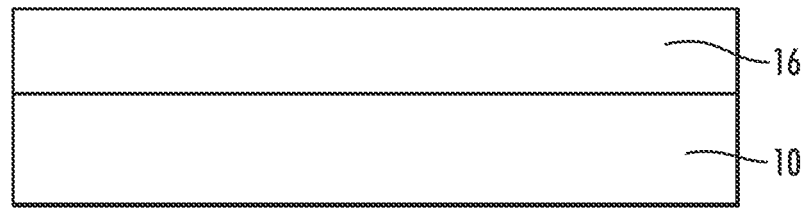
FIG. 1 is a schematic diagram of a first layer grown on a substrate.
Figure 2:
FIG. 2 is a schematic diagram of the first layer of FIG. 1 with a thin metal layer applied to the first layer, according to aspects of the disclosure.
Figure 3:
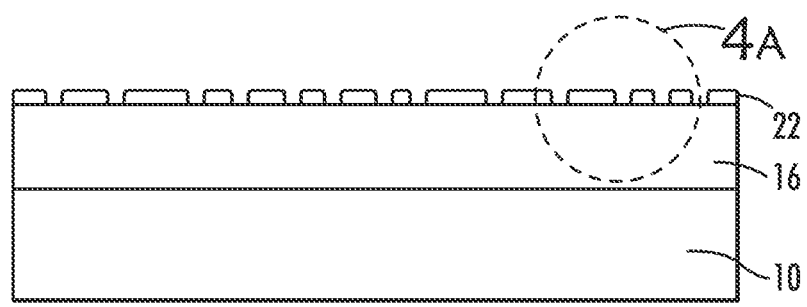
FIG. 3 is a schematic diagram of the thin metal layer after annealing, according to aspects of the disclosure.

Annealing metal layer 22 forms islands 24 forms island-like agglomerations in a natural, random pattern dictated by chemical and physical forces among the metal atoms that yield tiny islands with tiny gaps between them, as seen in FIG. 3 and in the detail of 4 A. By islands or island-like, it is meant that the metal atoms cluster and separate, and have various shapes, but their dimensions are on a nanometer scale ($10^{-6}$ to $10^{-9}$ meters with gaps between islands ranging from 20 nm to 200 nm).

Figure 4A:
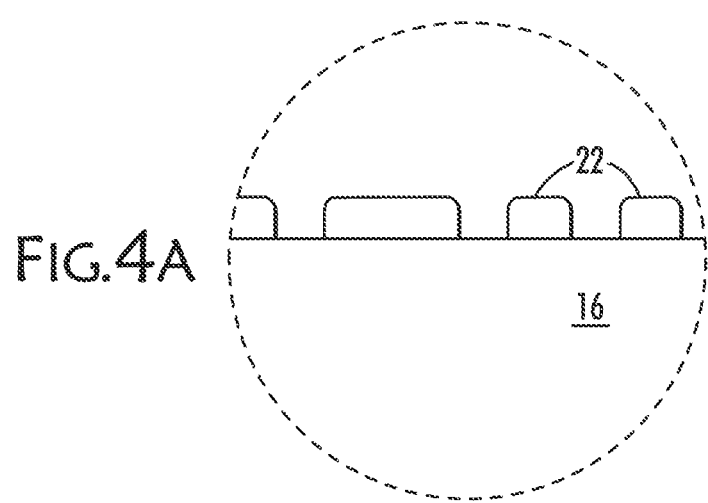
FIG. 4A is a detailed view of FIG. 3.
Figure 4B:
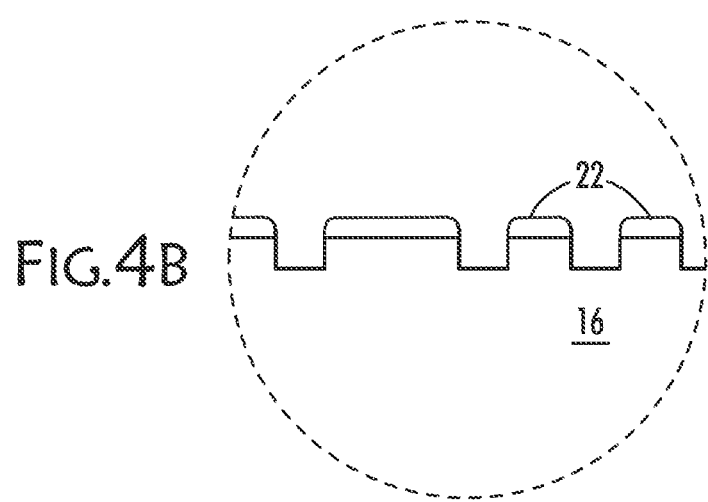
FIG. 4B shows the surface of the first layer after ionic etching has transferred the pattern of the annealed metal to the first layer.
Figure 4C:
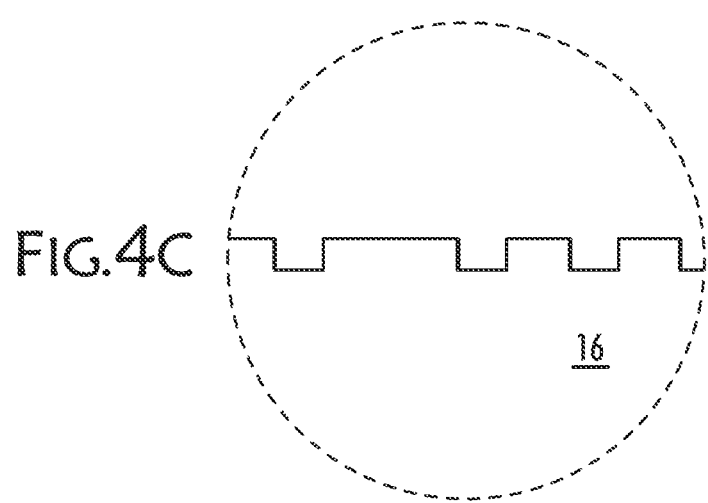
FIG. 4C is the surface after chemical etching has removed the remaining metal, according to aspects of the disclosure.
Figure 5:
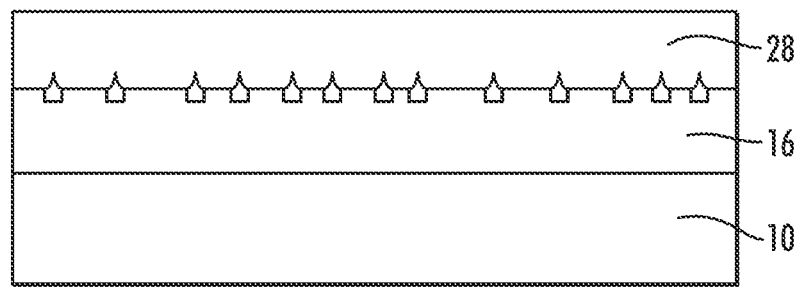
FIG. 5 is a schematic view of the template after growing the second layer, according to aspects of the disclosure.
Figure 6:
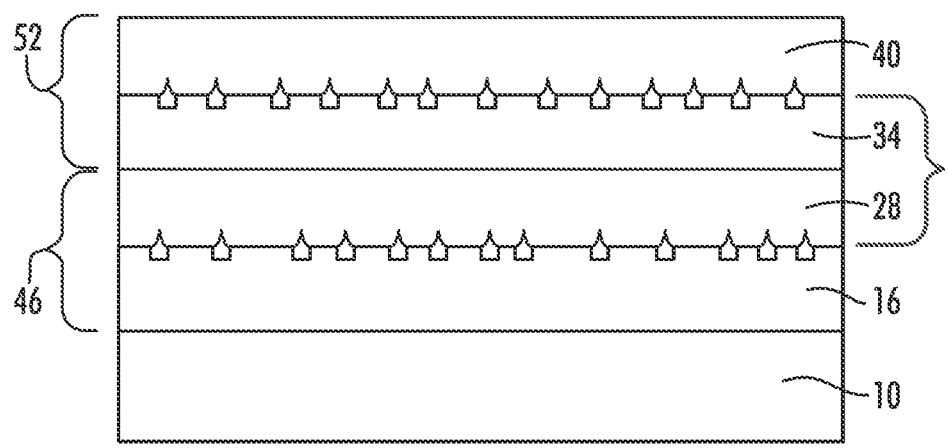
FIG. 6 is a schematic view of the template after growing a second pair of first and second layers, according to aspects of the disclosure.
Figure 7:
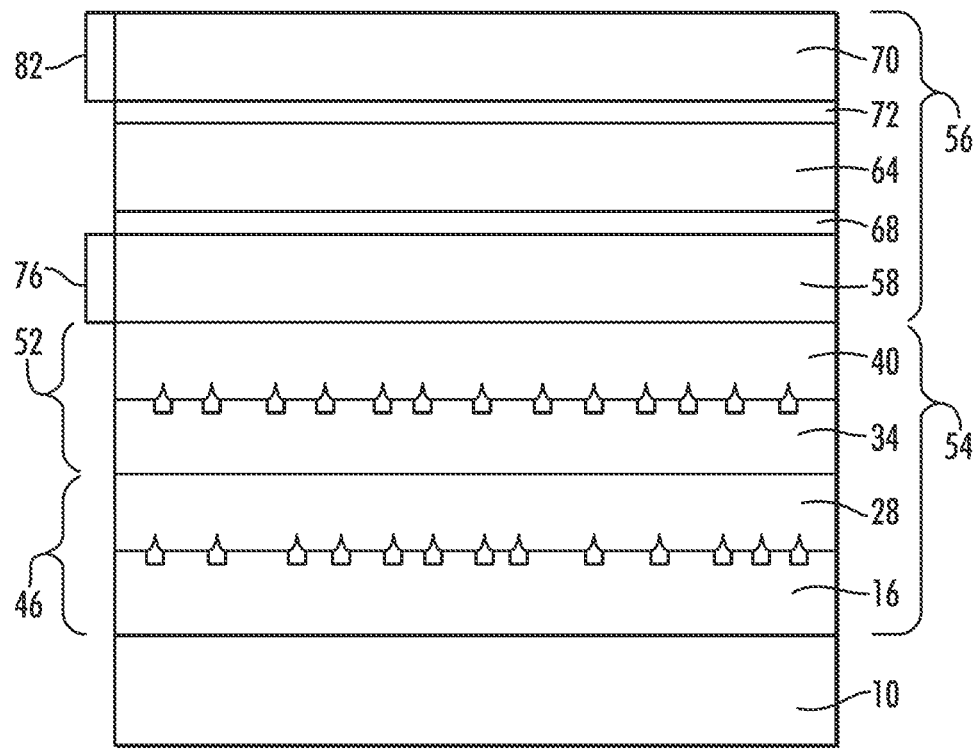
FIG. 7 is a schematic view of a light emitting diode grown on the template of FIG. 5, according to aspects of the disclosure.
Figure 8:
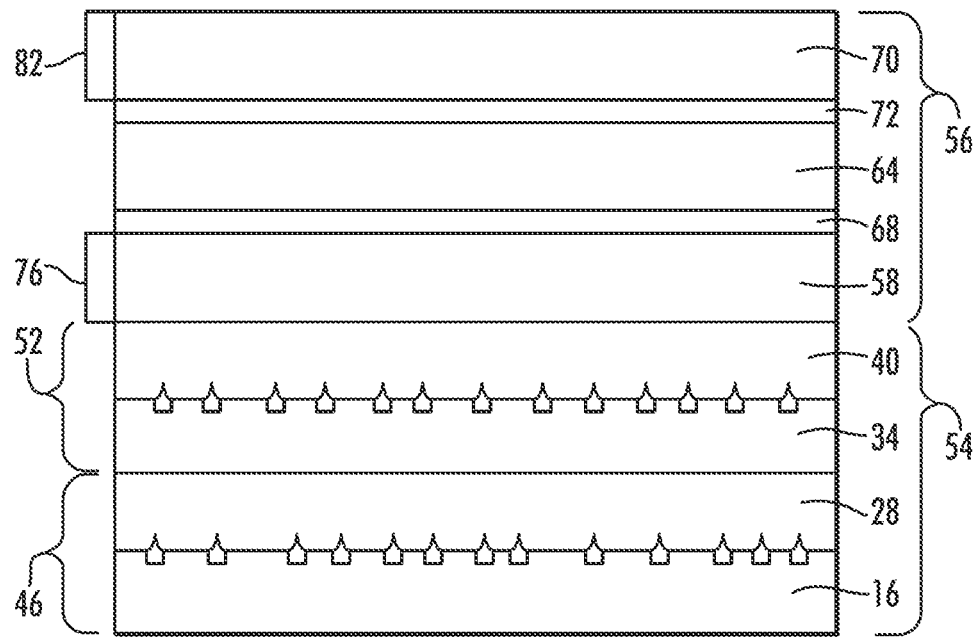
FIG. 8 is a schematic view of the light emitting diode of FIG. 7 with the substrate removed.

The random island-like pattern defined by the annealed metal is then transferred to the surface of the first layer in a two-step etching process, as illustrated in FIGS. 4B and 4C, respectively. The pattern may be transferred to first layer 16 by reactive ion or ICP etching, and is then followed by chemical cleaning to remove the metal of metal layer 22. Etching may be performed using gases such as chlorine, boron tri-chloride, argon, fluorine, silicon hexafluoride, carbon tetra-fluoride, or any combination of the above gases. Reactive ion etching with chorine etches Group III nitrides but is less effective etching metals such as gold, which makes it a good candidate for the present process.

After etching the pattern to transfer it to first layer 16, the remaining metal is removed by chemical etching. Chemical etching can be performed by buffered oxide etching or by dipping the sample in acids such as aqua-regia, sulphuric acid, phosphoric acid, nitric acid or in bases such ammonium hydroxide, potassium hydroxide, hydrogen peroxide or any combination of such acids and bases. Aqua regia is effective in dissolving gold.

At this point, and as shown in FIG. 4C, there is a pattern of tiny islands formed in first layer 16 and no remaining metal.

Now a second layer 28 is grown on first layer 16. Lateral overgrowth will coalesce over the islands transferred to the surface of first layer 16 and eliminate many lattice defects that would otherwise occur readily in the structure of second layer 28. The top surface of second layer 28 will be much smoother than first layer 16 and have a lower defect density than otherwise.

The process of growing a first layer 16, applying a metal layer 22, annealing metal layer 22, transferring the pattern formed by the annealed metal to first layer 16, and then growing second layer 28 on first layer 16, may be repeated to produce a third (patterned) layer 34 and a fourth (smooth) layer 40, and so on. First and second layers 16, 28 comprise a first layer pair 46; third and fourth layers 34, 40, comprise a second layer pair 52. Each layer pair 46, 52, reduces the defect density of the topmost surface and renders that surface a better one for a template 54, that is, one that has a lower defect density on which to build a device 56. Device 56 may be a light emitter, a light emitting diode, an ultraviolet light emitting diode, or a sensor capable of detecting photons.

First and second layers 16, 28, are grown either by metal-organic chemical vapor deposition (MOCVD) or metal-organic vapor phase epitaxy (MOVPE) in a reaction vessel. Either of these processes enables growth of crystalline layers by chemical reaction to create complex multi-layer structures. In the present process, first and second layers 16, 28, and the two layers of second layer pair 52 and any other layer pairs may be made of a material with high aluminum content, such as AlGaN, including AlN, AlInGaN and AlInGaBN, particularly for deep ultraviolet light applications, but the rest of Group III Nitride semiconductor materials: GaN, InGaN and InN, are also candidates for the present process of making a template or a semiconductor grown on a template according to an aspect of the disclosure.

As an example of a device 56, a light emitting diode may be grown on the present template 54 by growing a first conductive layer 58, such as an n-layer, followed by a quantum well 64 on the present template, and then a second conductive layer 70, such as a p-layer. A first electrical contact 76 is then attached to first conductive layer 58 and a second electrical contact 82 is attached to second conductive layer 70. For a device 56 that is a sensor, second conductive layer 70 and second electrical contact 82 are omitted. For a device 56 that is an ultraviolet light emitter, the choice of materials for the first and second conductive layers 58, 70, and quantum well 64 must have suitable band gaps.

Although illustrated as single layers, first and second electrically conductive layers 58, 70, may be formed of multiple layers. Each layer of those multiple layers has an elemental composition that may differ from one or more other layers of that electrically conductive layer.

Also, quantum well 64, although also illustrated as a single layer, preferably comprises several layers forming a quantum-well region. For an ultraviolet light emitting diode, quantum well 64 may have an emission spectrum ranging from 190 nm to 369 nm. Such a quantum well 64 may be made of $Al_xIn_yGa_{1-x-y}N$ wherein $0<x<1$, $0<y<1$, and $0<x+y<1$. Quantum well 64 has a surface 66. A first barrier layer 68 may be placed on surface 66 of quantum well 64, and quantum well 64 may end with a second barrier layer 72. First and second barrier layers 68, 72, may be made of $Al_xIn_yGa_{1-x-y}N$ wherein $0<x<1$, $0<y<1$ and $0<x+y<1$ and may have band gaps larger than the band gap of quantum well 64. In one aspect of the disclosure, quantum well 64 may comprise layers of $Al_xIn_yGa_{1-x-y}N$ wherein $0<x<1$, $0<y<1$, and $0<x+y<1$.

In another aspect of the disclosure, quantum well 64 is doped with at least one p-type dopant preferably selected from the group consisting of magnesium, zinc and beryllium. In another aspect of the disclosure, quantum well 64 is doped with at least one n-type and at least one p-type dopant. Quantum well 64 produces ultra-violet photons. In an aspect of the disclosure, the quantum well region emits photons having a wavelength λ in the range 190 nm<λ<240 nm. In another aspect of the disclosure, quantum well 64 emits or detects with a wavelength λ in the range 240 nm≤λ≤280 nm. In another aspect of the disclosure, quantum well 64 emits or detects photons having a wavelength λ in the range 280 nm<λ<320 nm. In another aspect of the disclosure, quantum well 64 emits or detects photons with a wavelength λ in the range 320 nm<λ<369 nm.

Barrier layers 68, 72, preferably include $Al_xIn_yGa_{1-x-y}N$, wherein $0<x<1$, $0<y<1$ and $0<x+y<1$, and the compositions of quantum well 64 and barrier layers 68, 72, may each be different. In one aspect of the disclosure, quantum well 64 is preferably doped with at least one n-type intentional dopant and other intentional dopants selected from the group consisting of silicon, oxygen and indium.

First and third layers 16, 28, may be bound by crystallographic faces with (0001), (1-100), (1011), (1-102), (11-20), (11-22) facets being aspects of the disclosure.

First and third layers 16, 34, may be deposited by controlling the flow of group III (Ga, Al and In) precursors and ammonia (NH3) and the ratio of Group III to Group V First and third layers 16, 34, preferably have growth rates of about 6 A to about 100 μm per hour with at least 0.2 μm per hour a particular aspect of the disclosure.

Second and fourth layers 28, 40, are deposited on first and third layers 16, 34, respectively, to produce a smooth top surface for template 54 by controlling the flow of group III precursors (Ga, Al and In) and ammonia (NH3). Second and fourth layers 28, 40, are deposited at a Group V-to-Group III ratio in the range of from 1 to 100000. Second and fourth layers 28, 40, preferably have a growth rate of at least 0.01 μm per hour and an $R_{rms}$ ranging from 1 A to 100 A.

Second and fourth layers 28, 40, are also defined as having at least one surface preferably selected from (001), (110), (101), (102), and (114) facets.

Second layer 28 and fourth layer 40 may be graded layers wherein the composition gradient is changes as a function of thickness so that they are less similar to that of first and third layers 16, 34, and are more similar to the composition of first conductive layer 58.

Each layer of template 54 and device 56 may be made of a Group III-nitride, preferably $Al_xIn_yGa_{1-x-y}N$ (wherein $0<x<1$, $0<y<1$ and $0<x+y<1$). The precursor sources include a metal-organic source, ammonia, a carrier gas and, optionally, doping sources such as silane, and/or biscyclopentadienyl magnesium. The metal-organic source is preferably trimethyl aluminum, triethyl aluminum, trimethyl gallium, triethyl gallium, trimethyl boron, trimethyl iron, triethyl indium or trimethyl indium. Suitable carrier gases are hydrogen and nitrogen and a combination of hydrogen and nitrogen.

In an alternative configuration and after construction, substrate 10 or all of template 54 may be removed by polishing, etching or lifting-off using a laser. First electrical contact 76 may be applied to the backside first conductive layer 58. Second electrical contact 82 may be attached to an opposing side of second conductive layer 70.

It is an ongoing desire to reduce resistance in a layer, and particularly, at the interface between layers. Resistance at the contact layers is a particular concern since resistance is a source of heat. As current increases, the temperature of the LED increases. Temperature limits the current at which an LED can be operated. With silicon doping, the operating temperature limit is a particular problem. The incorporation of indium in a layer reduces the resistance of a layer. Indium is particularly desirable in doped layers such as silicon-doped or magnesium-doped layers. At a given level of silicon doping, for example, incorporation of indium reduces the resistance thereby decreasing the heat generation which allows for an increase in the current at which the LED can be operated. In a silicon-doped layer, the indium is preferably present in an amount of atoms ranging from $10^{15}/cm^3$ to $10^{24}/cm^3$. In a magnesium doped layer the indium is preferably present in an amount of atoms ranging from $10^{15}/cm^3$ to $10^{24}/cm^3$.

It will be apparent to those skilled in the art of ultraviolet light-emitting diodes and laser diodes that many modifications and substitutions can be made to the method described herein without departing from the spirit and scope of the present disclosure which is specifically set forth in the appended claims.

What is claimed is:

1. A method of making a template for a semiconductor device, said method comprising the steps of:
    (a) providing a substrate;
    (b) depositing a first layer on said substrate, said first layer being made of Group III nitrides;
    (c) depositing a metal layer on said first layer;
    (d) annealing said metal layer at a temperature not higher than 500° C. for not longer than 15 seconds to form a pattern of islands;

(e) transferring said pattern of islands to said first layer;
(f) removing said metal layer from said first layer; and then
(g) depositing a second layer on said first layer, said second layer being made of Group III nitrides.

2. The method of claim 1, wherein said substrate is made of AlGaN.

3. The method of claim 1, wherein said metal layer is a gold metal layer.

4. The method of claim 3, wherein said metal layer is at most 5000 A thick.

5. The method of claim 1, wherein said temperature is at least 350° C.

6. The method of claim 1, wherein said annealing takes place for at least 10 seconds.

7. The method of claim 1, wherein said annealing takes place in air.

8. The method of claim 1, wherein said transferring step further comprises the steps of:
(a) etching said pattern of island into said first layer; and
(b) removing said metal layer.

9. The method of claim 8, wherein said etching is reactive ion etching.

10. The method of claim 9, wherein said etching is done with chlorine.

11. The method of claim 8, wherein said metal layer is removed using aqua regia.

12. A method of making a semi-conductor device, said method comprising the steps of:
(a) providing a substrate made of AlGaN;
(b) growing a template on said substrate, said template made by
  (i) depositing a first layer on said substrate, said first layer being made of Group III nitrides;
  (ii) depositing a metal layer on said first layer;
  (iii) annealing said metal layer at a temperature not higher than 500° C. for not longer than 15 seconds to form a pattern of islands;
  (iv) transferring said pattern of islands to said first layer;
  (v) removing said metal layer from said first layer; and then
  (vi) depositing a second layer on said first layer, said second layer being made of Group III nitrides; and
(c) growing a semiconductor device on said second layer, said semi-conductor device being made of Group III nitrides.

13. The method as recited in claim 12, further comprising the step of removing said substrate.

14. The method as recited in claim 13, further comprising the step of removing said template.

15. The method as recited in claim 12, wherein said growing a semiconductor step further comprises the steps of:
(a) growing a first conductive layer on said second layer, said first conductive layer being made of Group III nitrides;
(b) growing a quantum well on said first conductive layer said quantum well being made of Group III nitrides; and
(c) attaching a first conductor to said first conductive layer.

16. The method of claim 15, further comprising the step of growing a second conductive layer on said quantum well, said second conductive layer being a different polarity than said first conductive layer, said second conductive layer being made of Group III nitrides.

17. A template for use with a semiconductor device, said template made by a method comprising the steps of:
(a) providing a substrate made of AlGaN;
(b) depositing a first layer on said substrate, said first layer being made of Group III nitrides;
(c) depositing a layer of gold on said first layer;
(d) annealing said gold at a temperature not higher than 500° C. for not longer than 15 seconds to form a pattern of islands;
(e) transferring said pattern of islands to said first layer;
(f) removing said gold from said first layer; and then
(g) depositing a second layer on said first layer, said second layer being made of Group III nitrides.

18. A semiconductor device made a method comprising the steps of:
(a) providing a substrate made of AlGaN;
(b) depositing a first layer on said substrate, said first layer being made of Group III nitrides;
(c) depositing a metal layer of gold, palladium, or platinum on said first layer
(d) annealing said metal layer at a temperature not higher than 500° C. for not longer than 15 seconds to form a pattern of islands;
(e) transferring said pattern of islands to said first layer;
(f) removing said metal layer from said first layer; then
(g) depositing a second layer on said first layer, said second layer being made of Group III nitrides; and
(h) growing a semiconductor device on said second layer.

* * * * *